United States Patent [19]

Daikoku et al.

[11] Patent Number: 5,515,912
[45] Date of Patent: May 14, 1996

[54] COOLING APPARATUS OF ELECTRONIC DEVICES

[75] Inventors: Takahiro Daikoku, Ushiku; Noriyuki Ashiwake, Tsuchiura; Nobuo Kawasaki, Ibaraki; Shizuo Zushi, Hadano, all of Japan

[73] Assignee: Hitachi, Ltd., Tokyo, Japan

[21] Appl. No.: 664,605

[22] Filed: Mar. 4, 1991

[30] Foreign Application Priority Data

Mar. 2, 1990 [JP] Japan .................................. 2-049269

[51] Int. Cl.⁶ ............................ H01L 23/36; H01L 23/34
[52] U.S. Cl. ..................... 165/80.4; 165/185; 165/80.2; 361/699; 361/703
[58] Field of Search ...................... 165/80.2, 80.3, 165/80.4, 104.33, 104.31; 361/385, 699, 703

[56] References Cited

U.S. PATENT DOCUMENTS

| 4,448,240 | 5/1984 | Sharon .................................. 165/80.3 |
| 4,498,530 | 2/1985 | Lipschutz ............................... 165/80.3 |
| 4,770,242 | 9/1988 | Daikoku et al. ......................... 165/185 |

FOREIGN PATENT DOCUMENTS

| 126853 | 7/1985 | Japan . |
| 231744 | 10/1986 | Japan . |
| 204633 | 8/1988 | Japan . |

Primary Examiner—John K. Ford
Attorney, Agent, or Firm—Antonelli, Terry, Stout & Kraus

[57] ABSTRACT

A cooling apparatus of electronic devices including thermal conductive members each of which is positioned with one side thereof being in contact with a surface of each electronic device, the other side thereof being fitted to a housing with a small clearance provided therebetween, so as to diffuse and remove heat generated in the electronic devices. In order to press each thermal conductive member onto the associated electronic device, a resilient member is provided between the housing and the thermal conductive member, and is arranged to have a width larger than a width of grooves between fins formed on the housing and also larger than a width of grooves between fins formed on the thermal conductive member. A setting space to receive each resilient member therein is formed in a region where the fins are fitted to each other, so that the resilient member and the thermal conductive member can be fitted and positioned with respect to the housing when the resilient member is provided in this setting space.

14 Claims, 10 Drawing Sheets

COOLING APPARATUS OF ELECTRONIC DEVICES

BACKGROUND OF THE INVENTION

The present invention relates to a cooling apparatus for removing the heat generated in electronic devices such as semiconductor elements or integrated circuit chips.

In a large-sized electronic computer system, it is demanded that the processing operation is performed at high speed. To this end, a circuit chip on which a large number of semiconductor elements are integrated has been developed in recent years. Further, in order to shortened the electronic wiring for interconnecting such integrated circuit chips, a method of mounting a large number of such integrated circuit chips in a micropackage has developed.

Various types of cooling apparatus of electronic devices especially for use in the large-sized electronic computer system have been proposed. Cooling apparatus of semiconductor chips each of which performs a highly effective cooling and has a flexible structure for absorbing errors in assembling component parts and thermal deformations in vertical and lateral directions are disclosed in Japanese Patent Unexamined Publications Nos. 60-126853, 63-204633, and 61-231744, U.S. Pat. No. 4,498,530, and the like.

In, for example, Japanese Patent Unexamined Publication No. 60-126853 where a coiled spring is used for pressing a thermal conductive member provided with fins onto each semiconductor chip, with bores for inserting the spring being formed in a housing and a central portion of the thermal conductive member so as to fix the spring. These bores for inserting the spring interfere with thermal diffusion of the heat from a base portion of the thermal conductive member to fins of the thermal conductive member and from fins fitted with the fins of the thermal conductive member to the housing, thus deteriorating the performance of heat conduction. When machining of the bores for fixing the coiled spring is carried out by a commonly used tool, a bore for inserting the spring needs to be formed in the fins on one side, and then, bores for fixing the spring need to be formed in both the housing and the thermal conductive member, thereby increasing the number of machining operations. Moreover, if the thermal conductive member, the housing and the fins are made of ceramic material, the machining cannot be done easily without taking a long period of time, which results in a technical problem concerning mass production efficiency and the like. Furthermore, even if the spring is designed to be supported in the fixing bores, the spring may fall down when the housing and the thermal conductive member are assembled because the outer diameter of the spring is less than the width of each groove between the fins, thus making it difficult to assemble the housing and the thermal conductive member.

The conventional cooling apparatus disclosed in Japanese Patent Unexamined Publications Nos. 63-204633 and 61-231744 also involve the same type of problems.

In the conventional cooling apparatus disclosed in U.S. Pat. No. 4,498,530, a leaf spring is used for pressing a thermal conductive member onto each electronic device, and therefore, it is necessary to provide special means for retaining the leaf spring, thereby complicating the structure of the apparatus.

Other than the above-described conventional examples, there is proposed a cooling apparatus where continuous coil-like fins are fitted to each other without clearances provided therebetween, as disclosed in U.S. Pat. No. 4,448,240. However, machining and assembling of this cooling apparatus cannot be done without difficulty, involving a problem that electronic devices are not allowed to be tilted.

SUMMARY OF THE INVENTION

In order to solve the problems described above, an object of the present invention is to provide a cooling apparatus of electronic devices in which a space where a resilient member for pressing a thermal conductive member onto each semiconductor device is set can be obtained without deteriorating the performance of heat conduction.

Another object of the invention is to improve the productivity by facilitating machining to obtain the space for setting the resilient member, while requiring no special means for retaining the resilient member.

A further object of the invention is to provide a cooling apparatus of electronic devices which can be assembled without difficulty.

In order to achieve the above-described objects, the present invention provides a cooling apparatus of electronic devices comprising thermal conductive members each of which is positioned with one side thereof being in contact with a surface of each electronic device and the other side thereof being engaged with a housing with a small clearance provided therebetween. The thermal conductive members each include a base portion in contact with the surface of the electronic device and a plurality of first fins formed on the base portion, with the housing having a plurality of second fins formed thereon to be engaged with the first fins of the thermal conductive members with a small clearance provided therebetween. Resilient members having a width not less than a width of grooves between the first fins and also not less than a width of grooves between the second fins, respectively accommodated in a setting space which is formed in a region where the fins of the housing are engaged with the fins of each of the thermal conductive members so that the thermal conductive member is pressed onto the surface of the electronic device.

According to a further feature of the present invention, a cooling apparatus for electronic devices is provided which effects transmission of heat generated in the electronic devices mounted on a circuit substrate to a housing so as to diffuse and remove the heat, comprising thermal conductive members each of which is positioned with one side thereof being in contact with a surface of each electronic device, the other side thereof being engaged with the housing with a small clearance provided therebetween. Resilient members are interposed between the thermal conductive members and the housing, with each of the thermal conductive members including a base portion in contact with the surface of the electronic device and a plurality of first fins integrally formed on the base portion, and with the housing having a plurality of second fins formed thereon to be engaged with the first fins. The resilient members each have a width at least not less than a width of grooves between the second fins.

According to still further feature of the invention, a cooling apparatus for electronic devices is provided including flexible heat-conductive contacts to effect transmission of heat generated in the electronic device mounted on a circuit substrate to a housing so as to diffuse and remove the heat, with the flexible heat-conductive contacts each comprising a thermal conductive member contacted with a surface of each electronic device and provided with a plurality of first fins. A plurality of second fins are formed on the side of the housing and are engaged with the first fins of the thermal conductive member. A resilient member is accommodate in a setting space which is formed, extending over the plurality of fins, in a region where the fins are engaged with each other, so that the thermal conductive member is pressed onto the surface of the electronic device.

In accordance with yet further features of the invention, a cooling apparatus for electronic devices is provided comprising thermal conductive members each of which includes a plurality of first fins and contact a surface of each of electronic devices which are mounted on a circuit substrate. A housing surrounds the electronic devices, with second fins being engaged with the first fins of the thermal conductive members so as to transmit heat from the first fins to the housing. Resilient members are respectively provided in a region where the first and second fins are engaged with each other and have a width larger than a width of grooves between the first fins and also larger than a width of grooves between the second fins so that the thermal conductive member is pressed onto the surface of the electronic device. Setting or resilient member accommodate spaces are each formed in the region where the fins engaged with each other so as to respectively receive or accommodate the resilient members therein.

In accordance with additional features of the invention, a cooling apparatus for electronic devices is provided comprising thermal conductive members each of which includes a plurality of first fins, with second fins being engaged with the first fins so as to transmit heat from the first fins to a housing. Coil spring members each provided in the center of the first fins of each of the thermal conductive members and in a region where the first and second fins are engaged with each other. The coil spring members have a diameter larger than a width of grooves between the first fins and also larger than a width of grooves between the second fins, so that each of the thermal conductive members is pressed onto a surface of each of the electronic devices which are mounted on a circuit substrate. Setting portions are respectively formed in the region where the fins are engaged with each other so as to respectively receive or accommodate each of the resilient members therein.

In accordance with the present invention, a cooling apparatus for electronic devices is provided comprising thermal conductive members each of which include a plurality of first fins, with second fins being engaged with the first fins so as to transmit heat from the first fins to a housing. Resilient members having a width larger than a width of grooves between the first fins and also larger than a width of grooves between the second fins so that each of the thermal conductive members is pressed onto the surface of each of the electronic devices mounted on a circuit substrate. Setting portions are each formed in a region where the fins are engaged with each other so as to respectively receive or accommodate the resilient members therein. Each of the resilient members are contracted to have a width not more than the width of grooves between the first fins and the width of grooves between the second fins before being inserted in each of the setting portions.

According to still further features of the invention, a cooling apparatus for electronic devices is provided comprising thermal conductive members each of which includes a plurality of first fins, with second fins engaged with the first fins so as to transmit heat from the first fins to a housing. Setting spaces extend through the first and second fins in a direction perpendicular to the fins, with resilient members being received or accommodated in the setting spaces so that each of the thermal conductive members is pressed onto the surface of each of the electronic devices mounted on a circuit substrate.

In the present invention, since each of the resilient members which is provided between the housing and the associated thermal conductive member has a width not less than the width of the grooves between the fins formed on the housing and the width of the grooves between the fins formed on the thermal conductive member, displacements of the resilient member in longitudinal and lateral directions are restricted by the side walls or end faces of the fins of the housing or the thermal conductive member which are located at the setting space for the resilient member. Simultaneously, this resilient member can prevent the thermal conductive member from being relatively displaced from the housing. Therefore, unlike the conventional case, bores for fixing the resilient member need not be formed in the base portion of the thermal conductive member and the housing, and machining for forming the setting space for the resilient member becomes easier, for example, in that each of the fins can be fashioned by a single step of machining with a commonly used tool. According to the present invention, machining of the setting space for the resilient member can be performed without difficulty, thus improving the productivity. Besides, because bores for fixing the spring need not be formed in the base portion of the thermal conductive member and the housing, performance of heat conduction of the cooling apparatus can be prevented from deteriorating.

Moreover, according to the invention, the resilient member can be maintained at a precise position by the fins formed on the thermal conductive member and the housing. Consequently, special means are not required for retaining the resilient member, to thereby simplify the structure of the cooling apparatus and improve its productivity.

Furthermore, according to the invention, assembling of the cooling apparatus is easily accomplished because provision of the resilient member can be effected simply by inserting it into the setting space during the assembling operation, unlike the conventional case where the coiled spring needs to be closely fixed in the fixing bores. Since the spring is restricted by the side walls of the fins or the end faces of the cut-out portions or the slits of the fins, the spring can be prevented from being displaced or falling down in the assembling operation, thereby facilitating fitting of the thermal conductive member to the housing, with the spring being interposed therebetween.

Other characteristics, objects and advantages of the present invention will be understood from the following description of embodiments with reference to the attached drawings.

DETAILED DESCRIPTION OF PREFERRED EMBODIMENTS

Embodiments of the present invention will be hereinafter described in detail with reference to the attached drawings.

Figure 16:
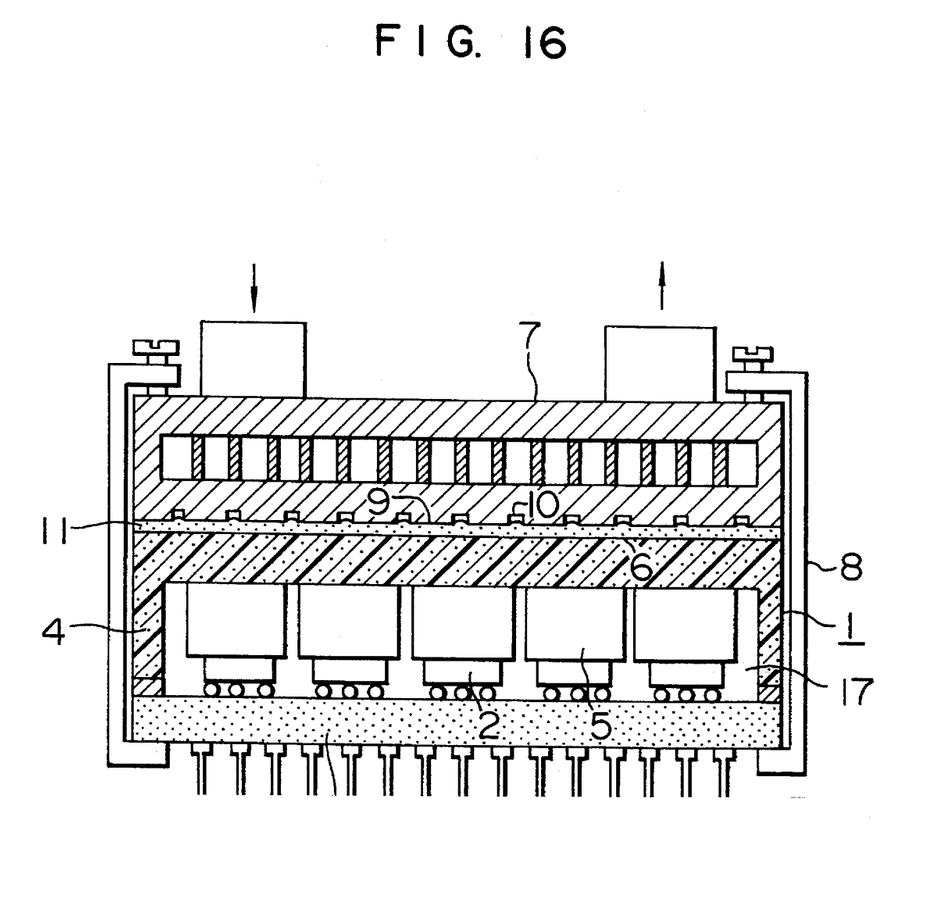
FIG. 16 is a vertical cross-sectional view of a construction of a cooling apparatus of an electronic device to which the present invention is applied.

Referring now to the drawings wherein like reference numerals are used throughout the various views to designate like parts and, more particularly, to FIG. 16 according to this figure, a multi-chip module includes a ceramic multi-layer wiring substrate 3 on which a large number of micro-chip carriers 2 incorporating LSI chips and are are air-tightly sealed by a ceramic housing 4. Heat generated in each LSI chip is transmitted to the ceramic housing 4 when a flexible heat-conductive contact 5 is pressed against the back surface of each micro-chip carrier 2. A water cooling jacket or a cooling member 7 containing cooling water of a low temperature is attached on a cooling surface 6 of the ceramic housing 4 by clamping means 8. A large number of grooves 10 are formed on a heat conduction surface 9 of the water cooling jacket 7, with the grooves being in communication with the environment surrounding the heat conduction surface 9. Further, grease 11 having high thermal conductivity is interposed between the cooling surface 6 of the ceramic housing 4 and the heat conduction surface 9 of the water cooling jacket 7. Within a closed space 17 which is defined between the wiring substrate 3 and the housing 4, there is filled a gas having high thermal conductivity such as helium gas or hydrogen gas. The heat, generated in the LSI chip, is transmitted to the flexible heat-conductive contact 5, maintained in contact with the associated micro-chip carrier 2, and then is transmitted from the heat-conductive contact 5 to the housing or package 4. From the cooling surface 6 of the housing 4, the heat is transmitted through the heat-conductive grease 11 to the heat conduction surface 9 of the water cooling jacket 7 so as to be finally carried away by cooling water.

Figure 1:
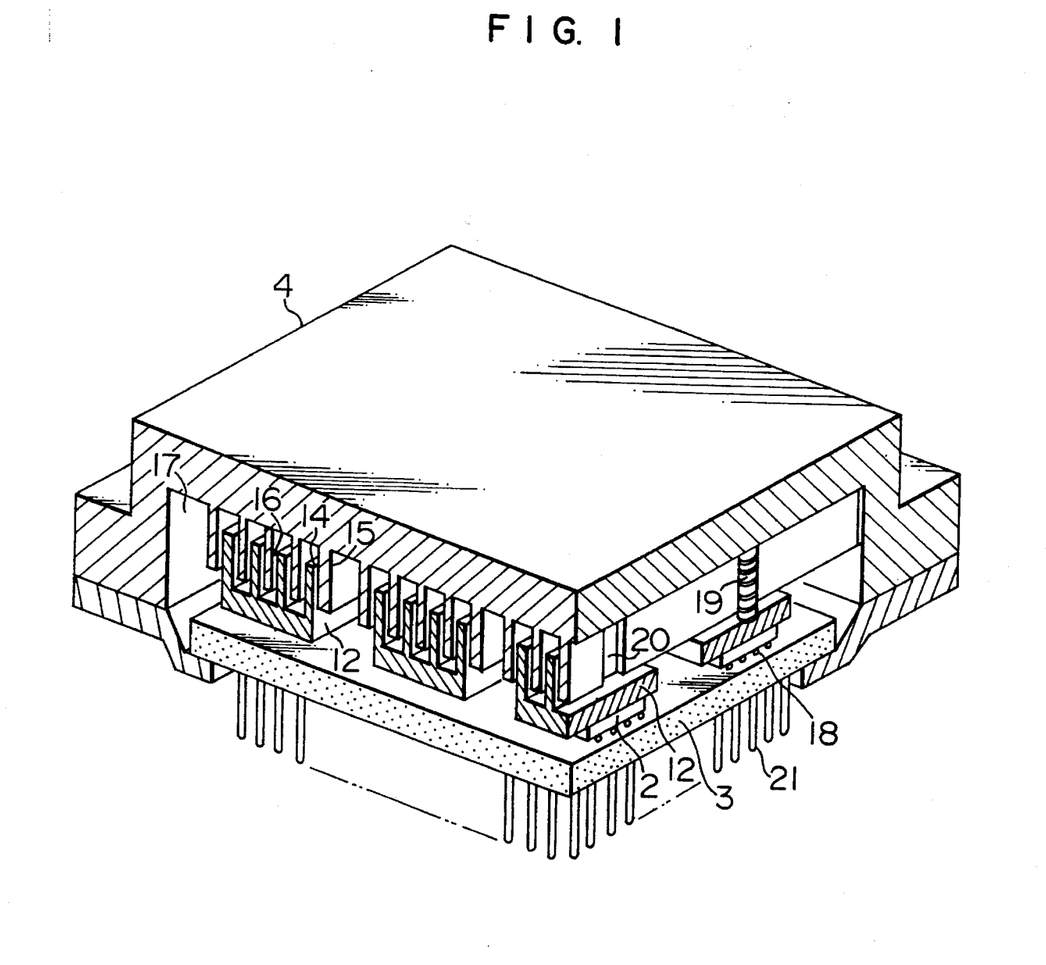
FIG. 1 is a perspective cross-sectional view showing one embodiment of a cooling apparatus of electronic devices according to the present invention.
Figure 2:
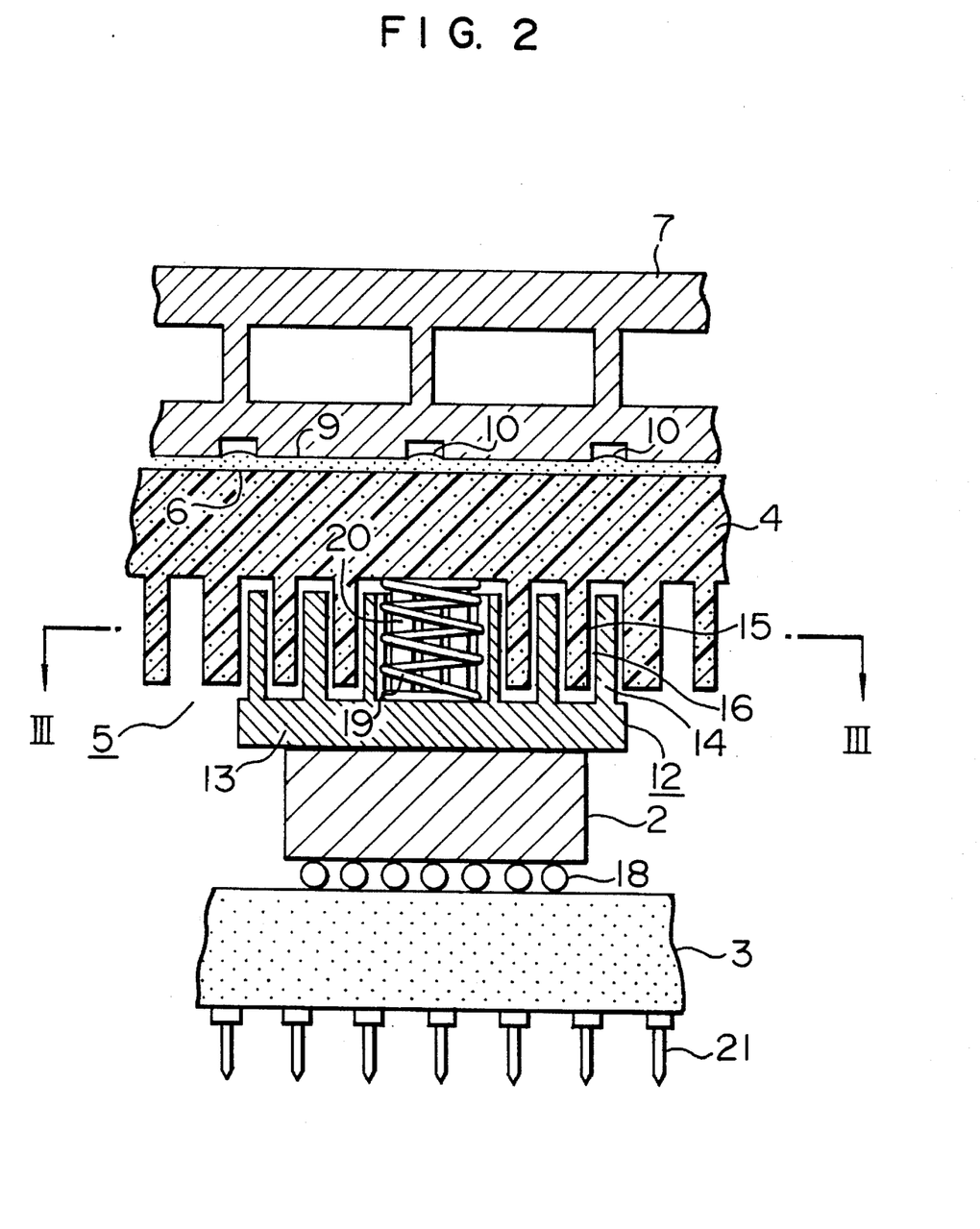
FIG. 2 is an enlarged vertical cross-sectional view of an essential portion of FIG. 1.

Referring to FIGS. 1 and 2, a thermal conductive member 12, serving as the flexible heat-conductive contact 5, is provided on the back surface of each of the micro-chip carriers 2 incorporating LSI chips which are mounted on the multi-layer wiring substrate 3, and a number of first fins 14 of a plate-like shape or a flat plate are formed on a base portion 13 of the thermal conductive member 12, extending in parallel to each other and perpendicular to this base portion. On the inner surface of the housing 4, fashioned of material having high thermal conductivity, a number of second fins 15 of a plate-like shape extending in parallel to each other are provided, over the entire length of the housing 4, at the same pitch as that at which the first fins 14 are provided.

The second fins 15 of the housing 4 and the first fins 14 on the base portion 13 of the thermal conductive member 12 are fitted with each other with small clearances 16 provided therebetween. The base portion 13 of the thermal conductive member 12 is pressed onto the micro-chip carrier 2 by a coiled spring or a resilient member 19 which has a small spring constant so as not to have any effect upon solder balls 18 for connecting the micro-chip carrier 2. It is thus kept in plane-contact with the back surface of the micro-chip carrier 2. The coiled spring 19 is inserted into a slit-like setting space 20 formed in the first and second fins 14, 15. Since the spring 19 acts at the base portion 13 of the thermal conductive member 12 and the housing 4, the thermal conductive member 12 can be stably pressed onto the micro-chip carrier 2, and the spring 19 can have a sufficient length. Further, it is also possible to prevent the base portion 13 of the thermal conductive member 12 from slipping off from the back surface of the micro-chip carrier 2, thereby maintaining the thermal conductive member 12 at all times in plane-contact with the micro-chip carrier 2 at a central portion thereof.

It should be noted that a fluid capable of high heat conduction such as heat conductive grease may be filled only in the small clearance 16.

The heat which has been generated in the LSI chip is once transmitted to the base portion 13 of the thermal conductive member 12 maintained in planar contact with the entire micro-chip carrier 2, and then is uniformly diffused within the base portion 13. After that, the heat is transmitted to each first fin 14 of the thermal conductive member 12. Next, the heat is transmitted to the second fins 15 of the housing 4 through the helium gas layer in the small clearances 15. The heat is finally carried away by the cooling device (water cooling jacket 7) mounted on the housing 4.

The substrate 3 in the above-described cooling apparatus, which includes a multi-layer electronic wiring of high density, is made of ceramic material such as alumina or mullite. Similarly, the housing 4 is, preferably, made of ceramic material such as SiC or AlN, taking account of conformity in thermal expansion coefficients of the housing 4 and the substrate, high thermal conductivity, electric insulation property and the like. A large number of pins 21 are provided on the bottom surface of the substrate 3 which are electrically connected with the solder balls 18.

Figure 3:
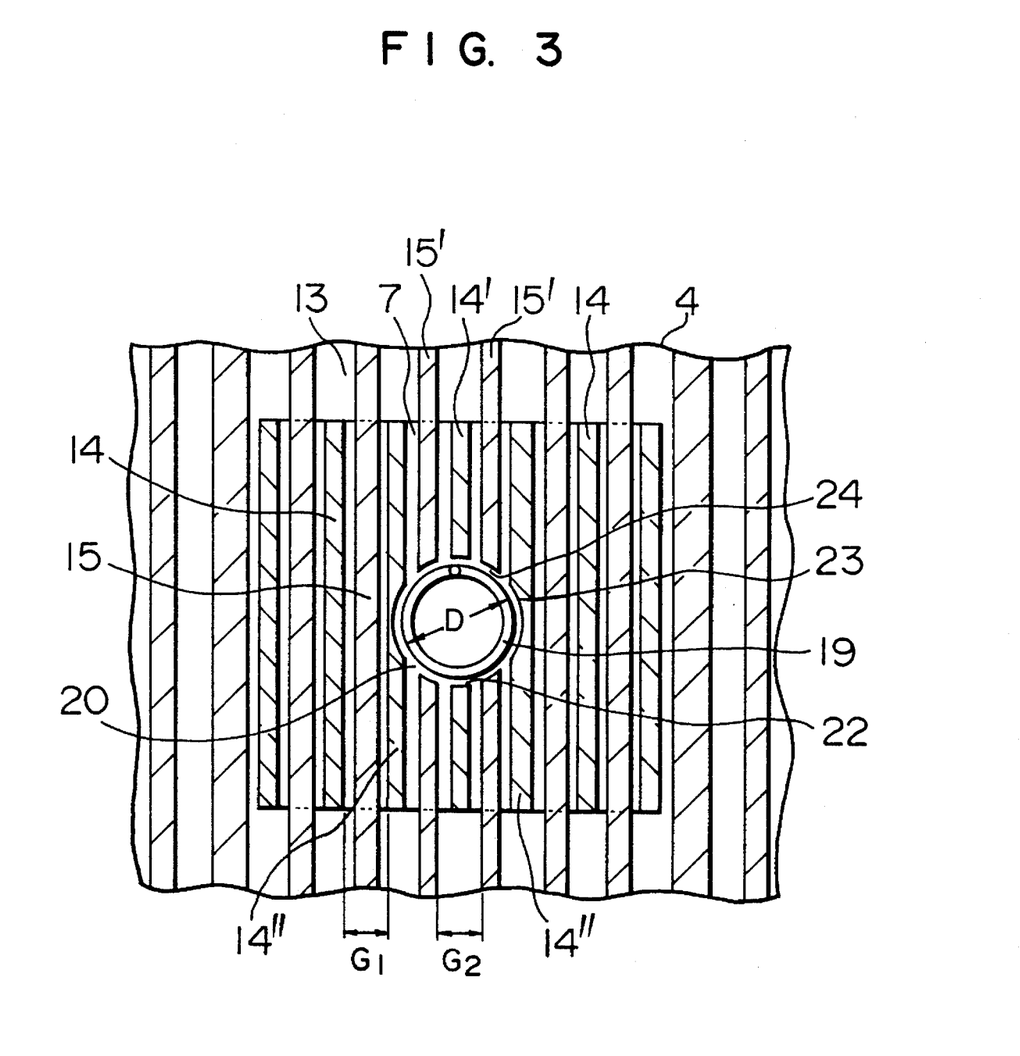
FIG. 3 is a cross-sectional view taken along the line III—III of FIG. 2.

Referring to FIGS. 2 and 3, an outer diameter D of the coiled spring 19 is not less than a width $G_1$ of a groove between two adjacent ones of the first fins 14 formed on the thermal conductive member 12, and it is also not less than a width $G_2$ of a groove between two adjacent second fins 15 formed on the housing 4. In the first fins 14, a center fin 14' is formed with a slit 22 when its central part is cut out, and two neighboring fins 14" on both sides of the center fin 14' are each formed with a cut.-out portion 23 at its central part, as shown in FIG. 3, so that the slit 22 and the cut-out portions 23 will serve as the setting space 20 in which the coiled spring 19 is received. The setting space 20 for the coiled spring 19 is likewise formed on the housing side. That is to say, as shown in FIG. 3, slits 24 are formed by cutting out portions of second fins 15' where the coiled spring 19 is to be received, thus serving as the setting or accommodating space 20 on the housing side. With this arrangement, the coiled spring 19, received in the setting space 20 is positioned with respect to the housing 4 by the end faces of the second fins in the setting space. Because the thermal conductive member 12 is contacted with the coiled spring 19 at the end faces of the first fins in the setting space 20, the thermal conductive member 12 is position with respect to the housing 4 through the coiled spring 19. More specifically, the coiled spring 19 causes the thermal conductive member 12 to be pressed or urged onto the surface of the micro-chip carrier 2, and prevents the thermal conductive member 12 from displacing in any longitudinal or lateral direction from the housing 4, so as to position the thermal conductive member 12 in the center of the micro-chip carrier 2, thereby preventing it from slipping off from the micro-chip carrier 2.

According to this embodiment, bores for fixing the spring, which are required in the conventional apparatus, need not be formed in the housing and the thermal conductive member, and, consequently, heat diffusion from the thermal conductive member 12 to the housing 4 can be performed without lowering its effectiveness, thus improving the performance of heat conduction. Since machining of the bores for fixing the spring is unnecessary, only machining for formation of the setting space 20 is required. Besides, each of the fins can be worked by a single step of machining, and the machining can be effected by a commonly used tool, so that it can be carried out easily, thereby improving the productivity. Moreover, special means for retaining the spring, required in the conventional apparatus where a leaf spring is employed, are not necessary in the present invention. Furthermore, because the plate-like fins are used in this embodiment in place of the continuous coil-like fins used in the different conventional apparatus, the machining can be readily done, and further it is extremely easy to fit the first fins and the second fins with each other. For example, after the housing 4 is placed horizontally with the second fins 15 being directed upwardly, the spring 19 is inserted into the space 20. As a result, the spring 19 is positioned without falling down. Then, the first fins 14 of the thermal conductive member 12 are fitted, from above, with the second fins 15 while inserting the spring 19 into the setting space 20 of the first fins 14. Thus, the fitting operation of the fins becomes easy, to thereby improve the efficiency of the assembling operation of the cooling apparatus as a whole. Also according to the present invention, the thermal conductive member 12 is allowed to be tilted; therefore, even if the micro-chip carrier 2 is tilted, the thermal conductive member 12 can be closely fitted onto the back surface of the micro-chip carrier 2, thereby enhancing the heat conductivity.

Since the spring 19 acts on the both ends to the bottom portion of the second fin 15 of the housing 4 and the base portion 13 of the thermal conductive member 12, the spring 19 can have a sufficient length, and the thermal conductive member 12 can be stably pressed onto the micro-chip carrier 2.

Needless to say, the depth of the setting space in the first and second fins where the spring is received may be smaller than the height of each fin.

Figure 4:
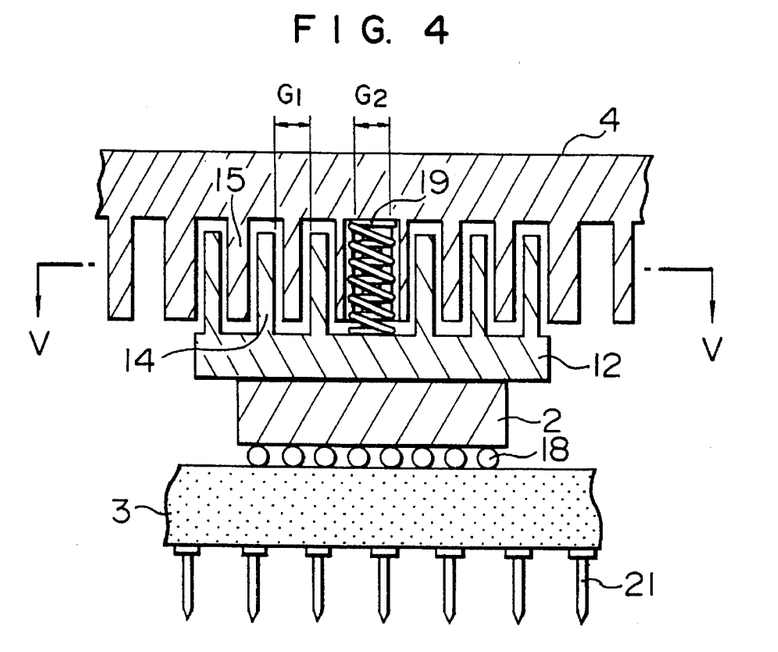
FIG. 4 is an enlarged vertical cross-sectional view of a portion of a modification of the invention.
Figure 5:
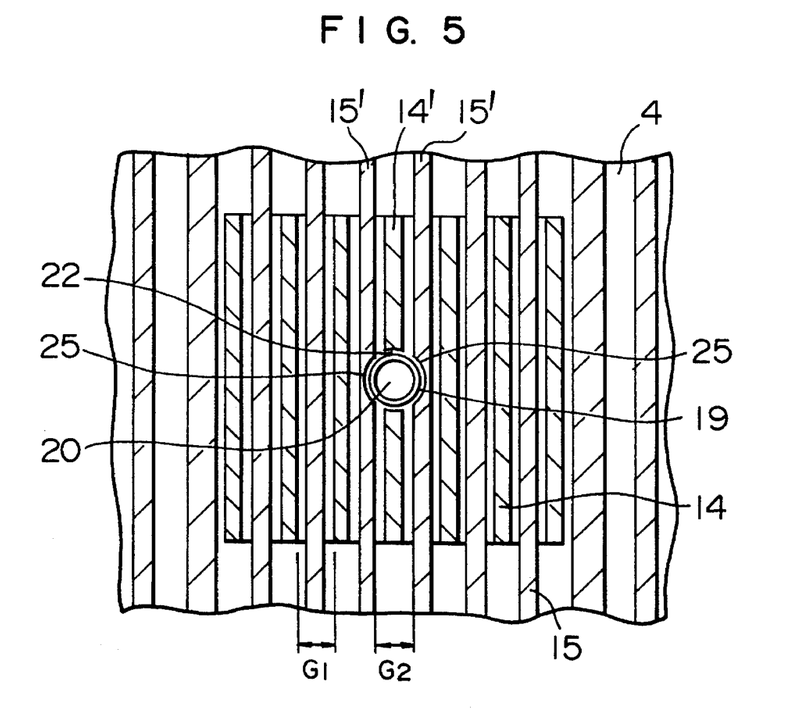
FIG. 5 is a cross-sectional view taken along the line V—V of FIG. 4.

Referring to FIGS. 4 and 5, an outer diameter of the coiled spring 19 is larger than the groove width $G_1$ between the first fins 14 and also larger than the groove width $G_2$ between the second fins 15, and the setting space 20 for the coiled spring 19 is formed on a slit 22 and cut-out portions 25. The slit 22 is formed by cutting out a central portion of the first fin 14' located at the center of the thermal conductive member 12, and the cut-out portions 25 are formed on the two neighboring second fins 15' in the housing 4 on the both sides of the first fin 14'.

In this modification, the coiled spring 19 is positioned with respect to the housing 4 by the end faces of the cut-out portions 25 of the second fins 15'. Contact of the first fins with the second fins prevents displacements of the thermal conductive member 12 in the lateral direction, and contact of the end faces of the slit of the first fins 14' with the coiled spring 19 prevents displacements of the thermal conductive member 12 in the longitudinal direction. According to this modification, therefore, the thermal conductive member 12 can be positioned with respect to the housing 4 by contact between the coiled spring 19 and the first fin 14, and contact between the first and second fins 14, 15, thereby producing the same effect as the embodiment illustrated in FIGS. 2 and 3.

Figure 6:
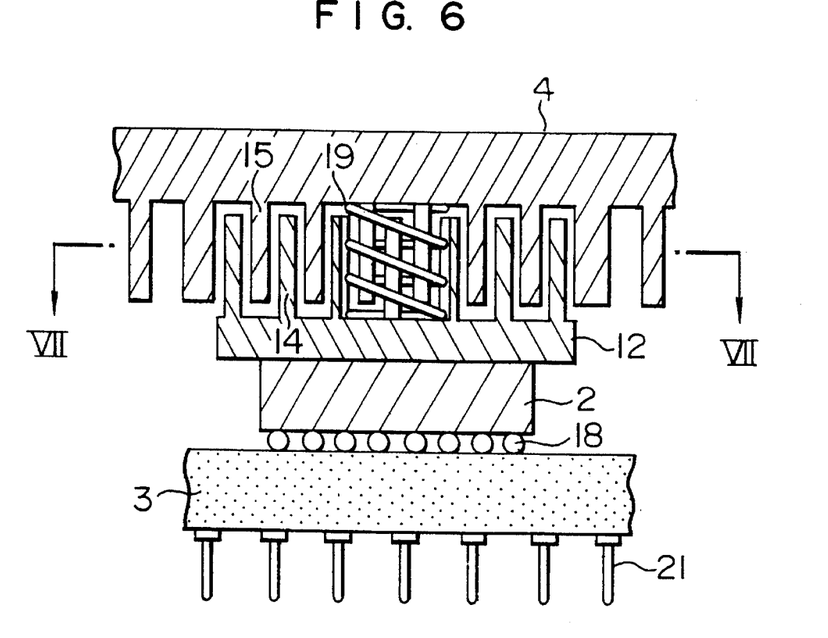
FIG. 6 is an enlarged vertical cross-sectional view of a portion of another modification of the invention.
Figure 7:
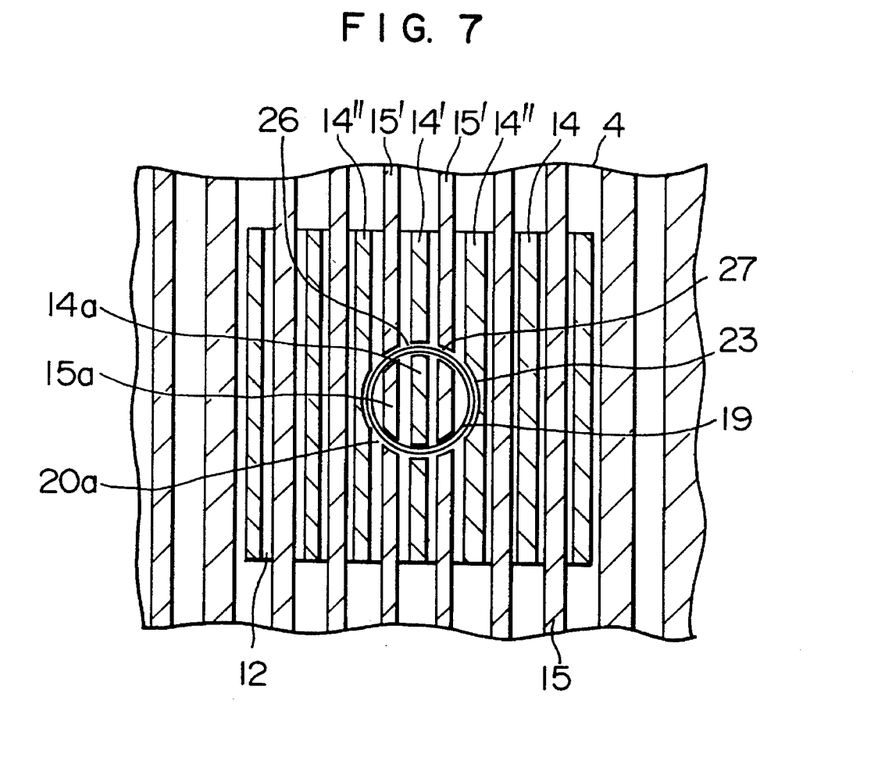
FIG. 7 is a cross-sectional view taken along the line VII—VII of FIG. 6.

In FIGS. 6 and 7, an outer diameter of the coiled spring 19 is larger than the groove width $G_1$ between the first fins 14 and also larger than the groove width $G_2$ between the second fins 15. As shown in FIG. 7, this coiled spring is inserted into a setting space or a recess 20a which has a circular or cylindrical shape to receive the coiled spring 19 therein. That is to say, the first fin 14' at the center of the thermal conductive member 12 is formed with slits 26 which define the circular-shaped or cylindrical setting space 20a, and the two neighboring first fins 14" on both sides of the center fin 14' are each formed with a cut-out portion 23 at its central part. The second fins 15' on the side of the housing 4 are also formed with slits 27 which define, together with the slits 26, the circular-shaped setting space 20a. As a result, the first fin 14' and the second fins 15' include portions 14a, 15a provided within the spring 19 in this modification, so that portions of the fins cut out to form the setting space 20a can be made as small as possible, to thereby enhance heat conductivity to a greater extent in comparison with the other embodiments. Additionally, since the setting space has a circular shape, and since the circular-shaped setting space has a large diameter, it is possible to maintain high peripheral velocity of a cutting tool and increase the strength of the tool in the cutting operation for machining the setting space, and it is also possible to supply lubricant oil through the center of the circular-shaped cutting tool during the cutting operation, thus facilitating the cutting work and improving efficiency of the machining.

The modification of FIGS. 6 and 7 produces the same effect as the embodiments described previously. In other words, displacements of the coiled spring 19 in the longitudinal and lateral directions are restricted with respect to the housing 4 by the end faces of the slits of the second fins 15', and the thermal conductive member 12 is contacted with the spring 19 through the end faces of the slits of the first fin 14' and through the cut-out portions 23 of the first fins 14", so that the thermal conductive member 12 will be positioned with respect to the housing 4 by the spring 19.

Figure 8:
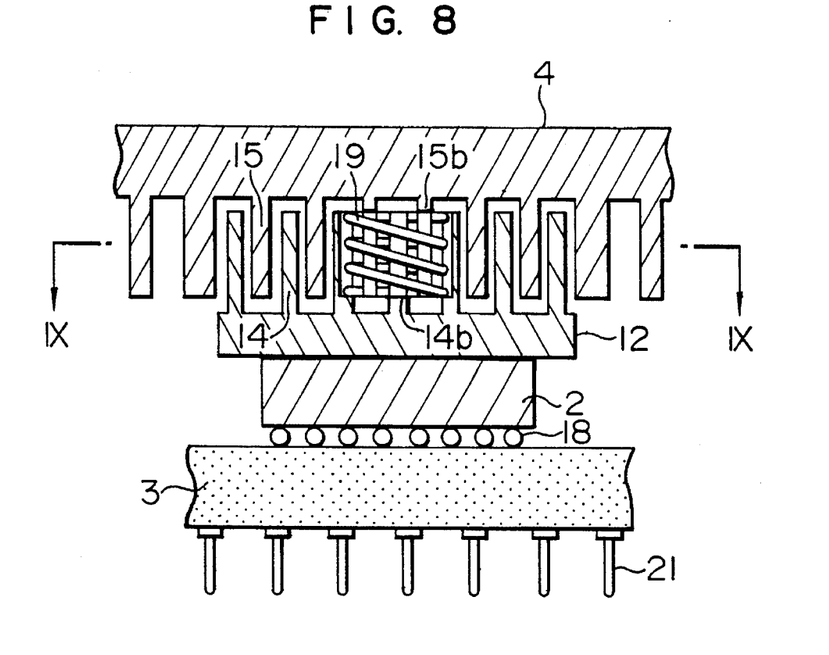
FIG. 8 is an enlarged vertical cross-sectional view at a portion of a further modification of the invention.
Figure 9:
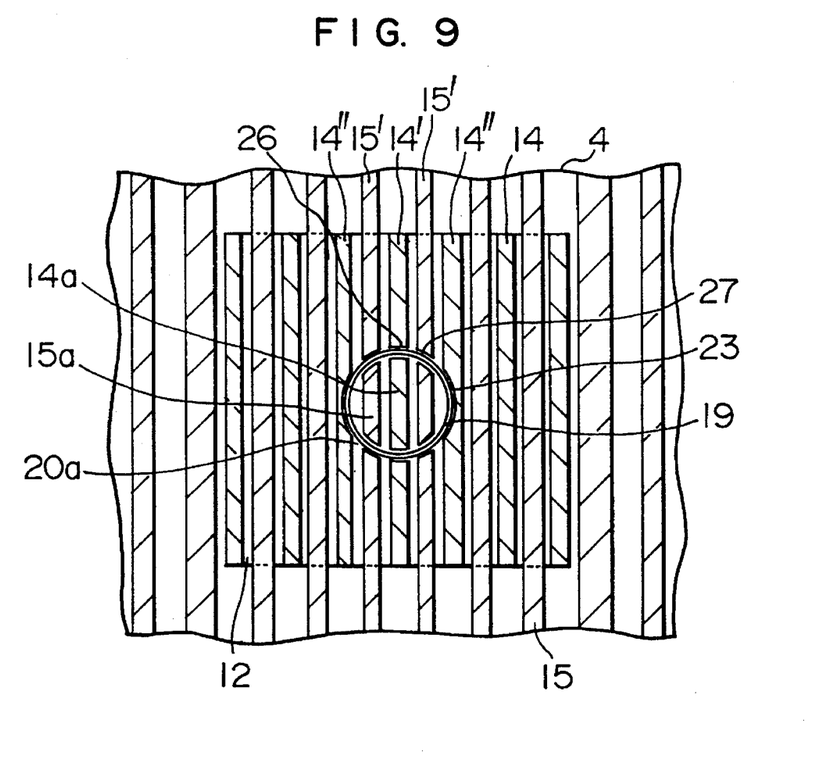
FIG. 9 is a cross-sectional view taken along the line IX—IX of FIG. 8.

In FIGS. 8 and 9, the circular-shaped setting space 20a in which the coiled spring 19 is received has a smaller depth. This modification produces the same effect as the embodiment described above. In addition, because the vertical length or the depth of the circular-shaped setting space 20a for the spring 19 is decreased to allow portions 14b, 15b of the respective fins to remain unworked, the time required for machining the setting space 20a is shortened to thus improve the productivity.

It should be noted that decrease of the depth of the setting space can be similarly applied to the outer embodiments described previously.

Figure 10:
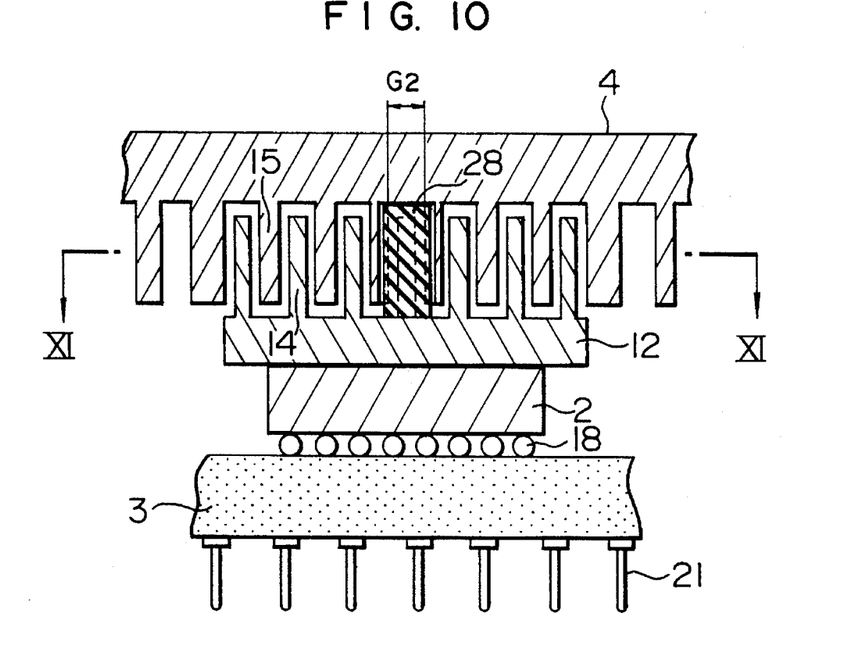
FIG. 10 is an enlarged vertical cross-sectional view of a portion of yet another different modification of the invention.
Figure 11:
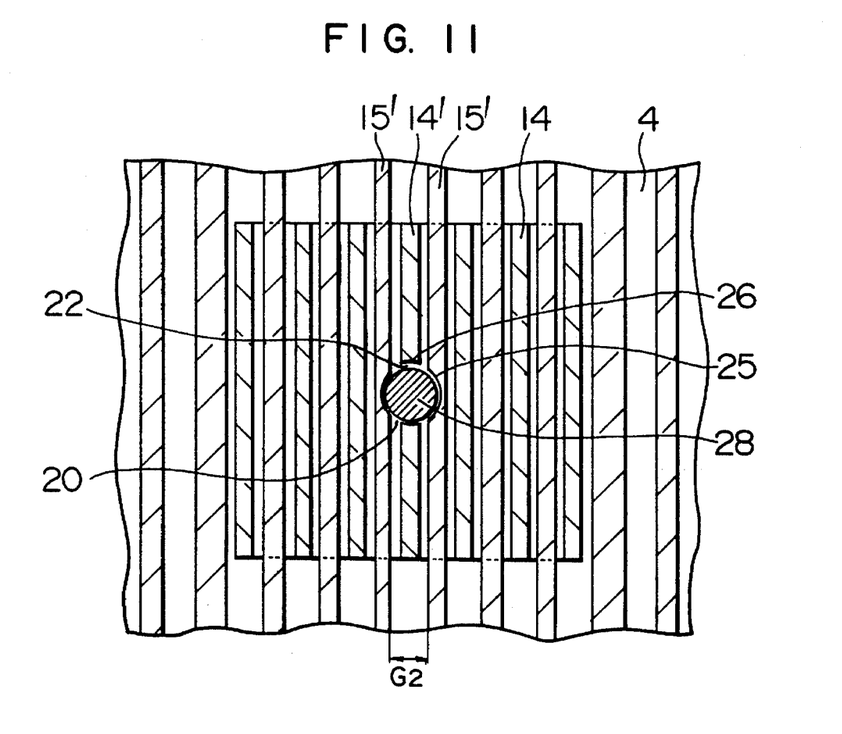
FIG. 11 is a cross-sectional view taken along the line XI—XI of FIG. 10.

In FIGS. 10 and 11, a solid columnar resilient member 28, made of rubber, is used in place of the coiled spring 19 used in the embodiments described previously. The resilient member 28 may have a hollow columnar shape, or a solid or hollow square pillar-like shape other than the solid columnar shape. A width of the resilient member 28 in this modification is not less than the groove width $G_2$ between the second fins 15. Portions of the second fins 15' where the resilient member 28 is received are worked into cut-out portions 25 having a shape in accordance with the exterior configuration of the resilient member 28, thus forming the setting space 20 for the resilient member 28.

This embodiment shown in FIGS. 10 and 11 has the same function and achieves the same effect as the embodiment shown in FIGS. 4 and 5. Further, it is advantageous in that resilient members of various shapes can be employed instead of the coiled spring.

Figure 12:
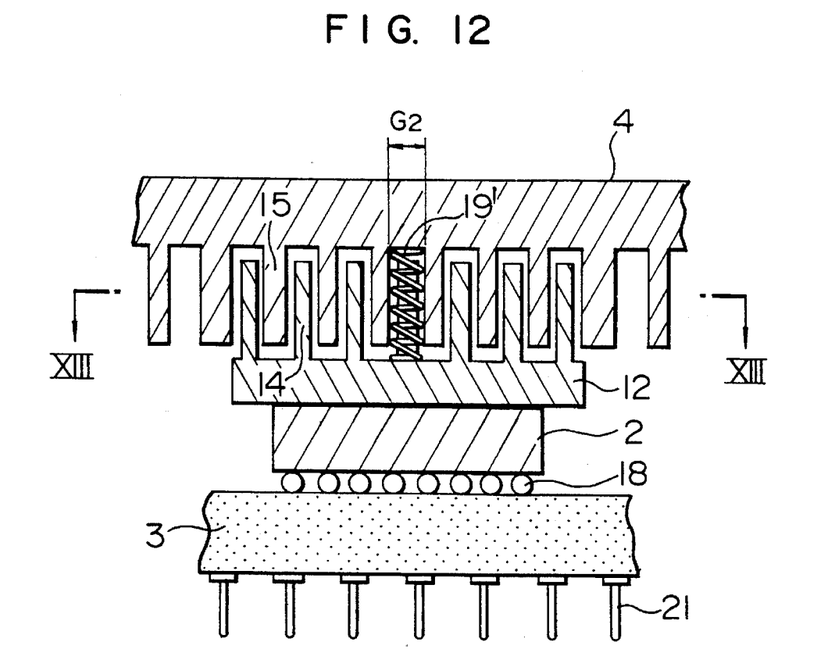
FIG. 12 is an enlarged vertical cross-sectional view of a portion of a still further modification of the invention.
Figure 13:
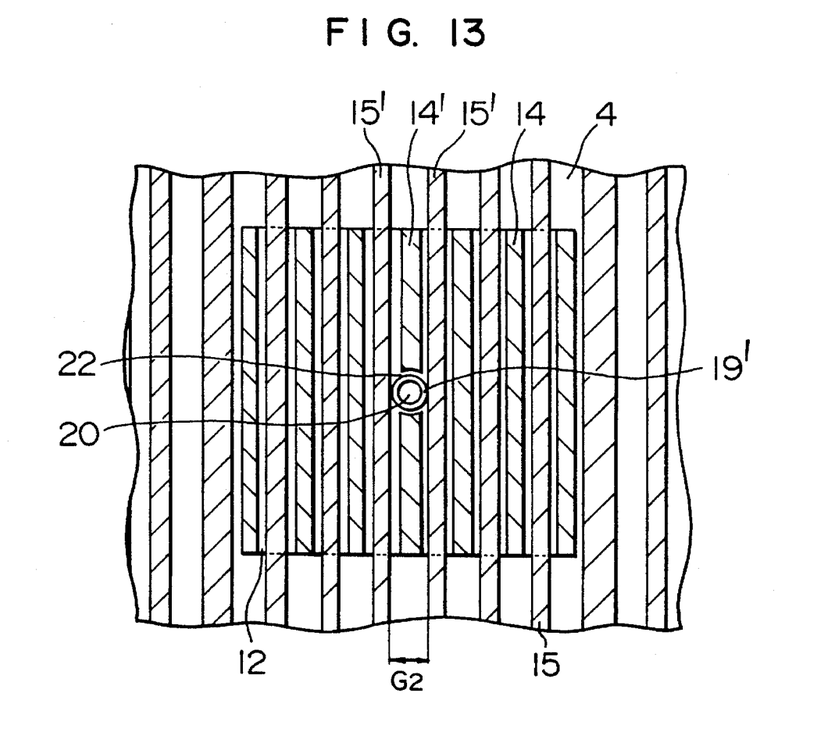
FIG. 13 is a cross-sectional view taken along the line XIII—XIII of FIG. 12.

In FIGS. 12 and 13, in order to press the thermal conductive member 12 onto the surface of an electronic device, there is employed a resilient member or a coiled spring 19' having a width or an outer diameter not less than the groove width $G_2$ between the second fins 15' where this resilient member is received. The resilient member is resiliently deformed or contracted so that its width becomes equal to or smaller than the above-mentioned groove width $G_2$, and then is inserted, as it is, into a gap between the second fins 15', whereas a slit 22 is formed in a central portion of the first fin 14' at the center of the thermal conductive member 12, to thereby provide the setting space 20 in which the resilient member 19' is received. With this arrangement, the resilient member 19' is fixed on the housing 4 due to frictional force caused by the resilient deformation, and the thermal conductive member 12 is positioned with respect to the housing 4 in the longitudinal direction by contact of the end faces of the slit of the first fin 14' with the resilient member 19', and in the lateral direction is also positioned by contact of the first fins 14 with the second fins 15.

In this case, positioning of the thermal conductive member 12 in the longitudinal direction is effected by frictional force between the second fins 15' and, the resilient member 19', and consequently, if this frictional force is not enough, the thermal conductive member 12 may be displaced in the longitudinal direction. However, the same function and effect as the above-described embodiment can be obtained when the frictional force is arranged to be large enough to prevent the thermal conductive member 12 from being displaced or when stoppers or the like are provided for preventing displacements of the thermal conductive member 12 in the longitudinal direction. Further, the slit 22 can be formed by the only work for providing the setting space 20, to thereby remarkably simplify the machining.

Figure 14:
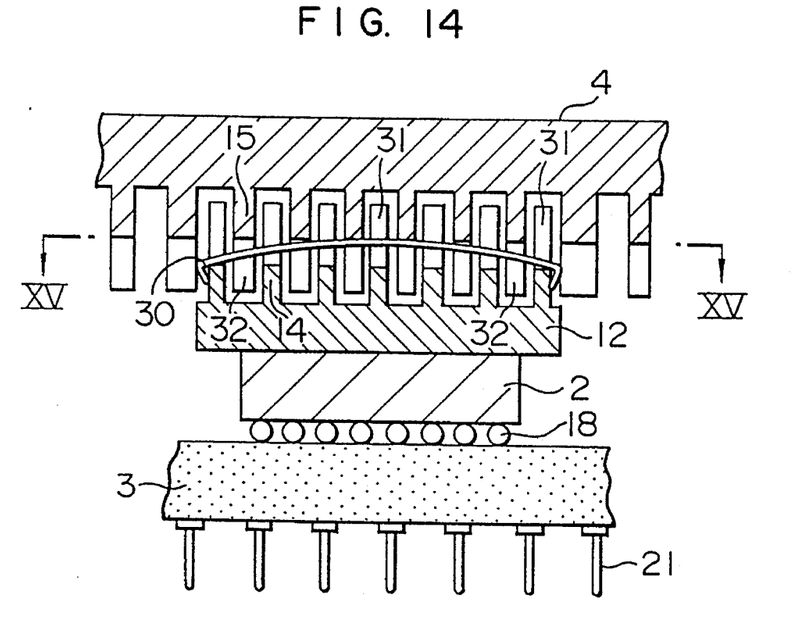
FIG. 14 is an enlarged vertical cross-sectional view of a portion of a further modification of the invention.
Figure 15:
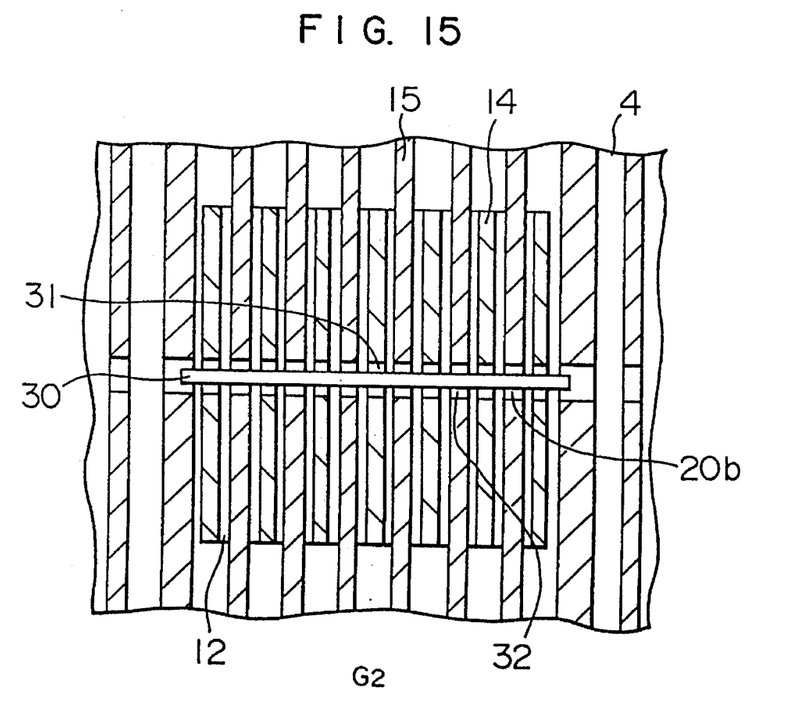
FIG. 15 is a cross-sectional view taken along the line XV—XV of FIG. 14.

In FIGS. 14 and 15, a leaf spring 30 is employed as a resilient member in place of a coiled spring and a resilient member made of rubber, with the leaf spring 30 being inserted into a groove-like setting space 20b extending in a direction perpendicular to the fins. The groove 31 extends in a direction perpendicular to the first fins 14 and has a depth not less than half of the height of the first fins 14 and is formed at a central portion of the first fins 14 of the thermal conductive member 12 along a direction of width of the fins, whereas, a groove 32, extending perpendicular to the second fins 15 and having a depth not less than half of the height of the second fins 15, is formed in the second fins 15 of the housing 4 at a position corresponding to the groove 31 in the first fins 14. Then, when the leaf spring 30 is inserted into these grooves 31, 32, a biasing force of the leaf spring 30 causes the thermal conductive member 12 to be closely fitted on the LSI chip 2 mounted on the substrate 3. Since displacements of the leaf spring 30 is restricted by side walls of the grooves 31, 32, the thermal conductive member 12 is positioned with respect to the LSI chip 2 without being displaced from the predetermined position on the housing 4.

In comparison with machining of a spring hole having a small diameter in the other embodiments described previously, simple machining of grooves in this embodiment can be readily effected by a con,only use tool. Therefore, the time required for the machining is remarkably shortened so as to improve the productivity.

Although the leaf spring 30 is used for describing this embodiment, a linear spring member such as a pin rod having a circular cross-section may be also used. The length and shape of a leaf spring, a pin-like linear spring member or the like are not restricted to those of this embodiment as long as the spring serves to prevent displacements of the thermal conductive member and exert biasing force onto the LSI chip.

According to the present invention, bores for fixing the resilient member which presses the thermal conductive member onto the semiconductor device need not be formed in the base portion of the thermal conductive member and the housing, and therefore, diffusion of the heat from the thermal conductive member to the first fins and from the second fins fitted with the first fins of the thermal conductive member to the housing is carried out effectively so as to improve the performance of heat conduction.

Moreover, the invention does not require machining of bores for fixing the resilient member, and special means for retaining the resilient member are not necessary, thus enhancing the productivity.

Furthermore, provision of the resilient member in this invention is accomplished by inserting the resilient member into the setting or accommodating space, so the cooling apparatus for electronic devices can be assembled without difficulty.

What is claimed is:

1. A cooling apparatus for electronic devices, the cooling apparatus comprising:

thermal conductive members respectively positioned with one side thereof in contact with a surface of each electronic device and an opposite side thereof engaged with a housing with a small clearance provided therebetween, said thermal conductive members each including a base portion in contact with the surface of said electronic device and a plurality of first fins formed on the base portion, said housing having a plurality of second fins formed thereon engageable with the first fins of said thermal conductive members with a small clearance provided therebetween;

resilient members having a width not less than a width of groove between the first fins and not less than a width of grooves between the second fins; and a space formed in a fin engaging region of said housing and said thermal conductive members for accommodating and supporting the respective resilient members whereby said thermal conductive member is urged in a direction of the surface of said electronic device.

2. A cooling apparatus according to claim 1, wherein each of said resilient members is one of coiled springs, solid columnar resilient members made of rubber and hollow columnar resilient members of rubber, said resilient members having one of a width and an outer diameter which is not less than the width of grooves between the first fins and also not less than the width of grooves between the second fins, and wherein the spaces for respectively accommodating said resilient members is formed by cutting out portions of said first and second fins.

3. A cooling apparatus according to claim 1, wherein the space for each of said resilient members if formed in a center of each of said thermal conductive members.

4. A cooling apparatus according to claim 1, wherein the spaces for respectively accommodating said resilient members is one of a bore and a recess having one of circular, polygonal and ring shape.

5. A cooling apparatus according to claim 4, wherein the spaces for respectively accommodating said resilient members shaped like a bore has a height substantially equal to a height of each of said fins.

6. A cooling apparatus for electronic devices which effects transmission of heat generated in the electronic devices mounted on a circuit substrate to a housing so as to diffuse and remove said heat, the cooling apparatus comprising:

thermal conductive members respectively positioned with one side thereof in contact with a surface of each electronic device and an opposite side thereof engaged with the housing with a small clearance provided therebetween;

resilient members interposed between said thermal conductive members and said housing, each of said thermal conductive members including a base portion in contact with the surface of said electronic device and a plurality of first fins integrally formed on the base portion, said housing having a plurality of second fins formed thereon and engageable with said first fins, and wherein said resilient members each have a width of at least not less than a width of grooves between said second fins.

7. A cooling apparatus for electronic devices including flexible heat-conductive contacts to effect transmission of heat generated in the electronic devices mounted on a circuit substrate to a housing so as to diffuse and remove said heat, said flexible heat conductive contacts each comprising:

a thermal conductive member in contact with a surface of each electronic device and provided with a plurality of first fins;

a plurality of second fins formed on a side of the housing and engaged with the first fins of said thermal conductive member;

a resilient member extending substantially perpendicular to said substrate over said plurality of fins in a fin engaging region of said first and second fins; and a space for accommodating and supporting said resilient member, whereby said thermal conductive member is urged in a direction of the surface of said electronic device.

8. A cooling apparatus for electronic devices, the cooling apparatus comprising:

thermal conductive members each provided with a plurality of first fins in contact with a surface of each of the electronic devices mounted on a circuit substrate;

a housing surrounding said electronic devices;

second fins engaged with the first fins of said thermal conductive members so as to transmit heat from the first fins to said housing;

resilient members respectively provided in a fin engaging region of said first and second fins, wherein each of said resilient members has a width larger than a width of grooves between the first fins and also larger than a width of the grooves between the second fins so that the thermal conductive member is urged in a direction of the surface of said electronic device; and spaces formed in the fin engaging region for receiving and accommodating the respective resilient members therein.

9. A cooling apparatus for electronic devices, the cooling apparatus comprising:

thermal conductive members each provided with a plurality of first fins;

second fins engaged with the first fins so as to transmit heat from the first fins to a housing;

coil spring members each provided in the center of the first fins of each of said thermal conductive members and in a fin engaging region of the first and second fins, said coil spring members having a diameter larger than a width of grooves between the first fins and also larger than a width of grooves between the second fins, so that each of said thermal conductive members is urged in a direction of a surface of each of said electronic devices mounted on a circuit substrate; and setting portions respectively formed in the fin engaging region for respectively accommodating and supporting said coil spring members therein.

10. A cooling apparatus according to claim 9, wherein a slit is formed by cutting out a central portion of a center one of said first fins provided on each of said thermal conductive members, and slits are formed adjacent to said slit of the first fin by cutting out portions of two of said second fins on both sides of the first fin formed with said slit, wherein said cut-out portions are formed in central portions of two of said first fins on both sides of the center first fin, so that each of said setting portions is formed of said slits of said first and second fins and said cut-out portions of the first fins.

11. A cooling apparatus according to claim 9, wherein a slit is formed by cutting out a central portion of a center one of said first fins provided on each of said thermal conductive members, and cut-out portions are formed adjacent to said slit of the first fin by cutting out portions of two of said second fins on both sides of the first fin formed with said slit, so that each of said setting portions in which said coil spring members is set is formed of said slit and said cut-out portions.

12. A cooling apparatus according to claim 9, wherein each of said setting portions includes a ring-shaped setting space for receiving said coil spring members therein, with said setting space being defined by slits and cut-out portions formed in said first and second fins.

13. A cooling apparatus according to claim 12, wherein slits are formed in a center one of said first fins provided on each of said thermal conductive members and two of said second fins on both sides of said first fins so as to define the ring shaped setting space, and cut-out portions are formed in central portions of two of said first fins on both sides of the center first fin so as to define, together with said slits, the ring shaped setting space.

14. A cooling apparatus according to claim 12, wherein portions of the first and second fins exist within the ring shaped setting space.

* * * * *